United States Patent
Yeung et al.

[19]

[11] Patent Number: 5,889,436
[45] Date of Patent: *Mar. 30, 1999

[54] PHASE LOCKED LOOP FRACTIONAL PULSE SWALLOWING FREQUENCY SYNTHESIZER

[75] Inventors: Pak-Ho Yeung, San Jose; Kern Wai Wong; Laurence D. Lewicki, both of Sunnyvale, all of Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 742,331
[22] Filed: Nov. 1, 1996
[51] Int. Cl.$^6$ ................................ H03L 7/099
[52] U.S. Cl. ........................ 331/2; 331/14; 331/25; 331/34; 331/45; 331/57
[58] Field of Search ................... 331/2, 14, 18, 331/34, 25, 57, 45

[56] References Cited

U.S. PATENT DOCUMENTS

| | | | |
|---|---|---|---|
| Re. 34,831 | 1/1995 | Lund | 375/1 |
| 3,928,813 | 12/1975 | Kingsford-Smith | 331/1 A |
| 3,959,737 | 5/1976 | Tanis | 331/1 A |
| 4,179,670 | 12/1979 | Kingsbury | 331/10 |
| 4,303,893 | 12/1981 | Goldberg | 331/1 A |
| 4,409,564 | 10/1983 | Lo | 331/16 |
| 4,458,329 | 7/1984 | Remy | 364/851 |
| 4,468,632 | 8/1984 | Crowley | 331/14 |
| 4,492,936 | 1/1985 | Albarello et al. | 331/128 |
| 4,573,176 | 2/1986 | Yeager | 377/48 |
| 4,584,695 | 4/1986 | Wong et al. | 375/81 |
| 4,586,005 | 4/1986 | Crawford | 331/1 A |
| 4,686,488 | 8/1987 | Attenborough | 331/2 |
| 4,800,342 | 1/1989 | Jackson | 331/10 |
| 4,815,018 | 3/1989 | Reinhardt et al. | 364/701 |
| 4,816,774 | 3/1989 | Martin | 331/1 A |
| 4,918,405 | 4/1990 | Herleikson | 331/11 |
| 5,018,169 | 5/1991 | Wong et al. | 375/119 |
| 5,038,117 | 8/1991 | Miller | 331/16 |
| 5,038,120 | 8/1991 | Wheatley et al. | 332/128 |
| 5,055,800 | 10/1991 | Black et al. | 331/1 A |
| 5,059,924 | 10/1991 | JenningsCheck | 331/35 |
| 5,068,628 | 11/1991 | Ghoshal | 331/25 |
| 5,079,521 | 1/1992 | Gaskell et al. | 331/1 A |
| 5,124,670 | 6/1992 | Lawton | 331/10 |
| 5,166,642 | 11/1992 | Hietala | 331/1 A |
| 5,202,642 | 4/1993 | Dixon | 328/14 |
| 5,224,132 | 6/1993 | Goldberg | 377/48 |
| 5,233,316 | 8/1993 | Yamada et al. | 331/1 A |
| 5,267,189 | 11/1993 | Wilke | 364/851 |
| 5,305,362 | 4/1994 | Miller | 377/48 |
| 5,355,037 | 10/1994 | Andresen et al. | 307/602 |
| 5,389,898 | 2/1995 | Taketoshi et al. | 331/49 |
| 5,394,116 | 2/1995 | Kasturia | 331/34 |
| 5,424,687 | 6/1995 | Fukuda | 331/11 |
| 5,448,191 | 9/1995 | Meyer | 327/105 |
| 5,629,651 | 5/1997 | Mizuno | 331/34 |

OTHER PUBLICATIONS

Bartruni et al., "Mixed Digital/Analog Signal Processing for a Single–Chip 2B1Q U–Interface Transceiver," *IEEE Journal of Solid–State Circuits*, 25:6–1414–1425 (Dec., 1990).

*Primary Examiner*—Siegfried H. Grimm
*Attorney, Agent, or Firm*—Skjerven, Morrill, MacPherson, Franklin & Friel; Brian D. Ogonowsky

[57] ABSTRACT

A phase-locked loop (PLL) frequency synthesizer is described which incorporates a fractional pulse swallowing circuit. The fractional pulse swallowing circuit does not add or delete pulses but extends or shortens pulses by a fractional amount. This avoids large phase errors generated by a phase detector in the PLL. In the preferred embodiment, the PLL uses a voltage controlled oscillator (VCO) formed of a ring oscillator. The outputs of the stages of the ring oscillator are applied to input terminals of a multiplexer. The multiplexer is controlled at certain times to output a different tapped signal from the ring oscillator to effectively adjust the phase of the signal output from the multiplexer. By so controlling the multiplexer, fractional pulses are subtracted or added at intervals to either increase or decrease the average frequency of the signal output from the multiplexer. The output of the VCO is fed back to the input of a phase detector along with a reference frequency. Alternatively, the output of the pulse swallower, and not the VCO, provides the feedback signal for the phase detector.

13 Claims, 6 Drawing Sheets

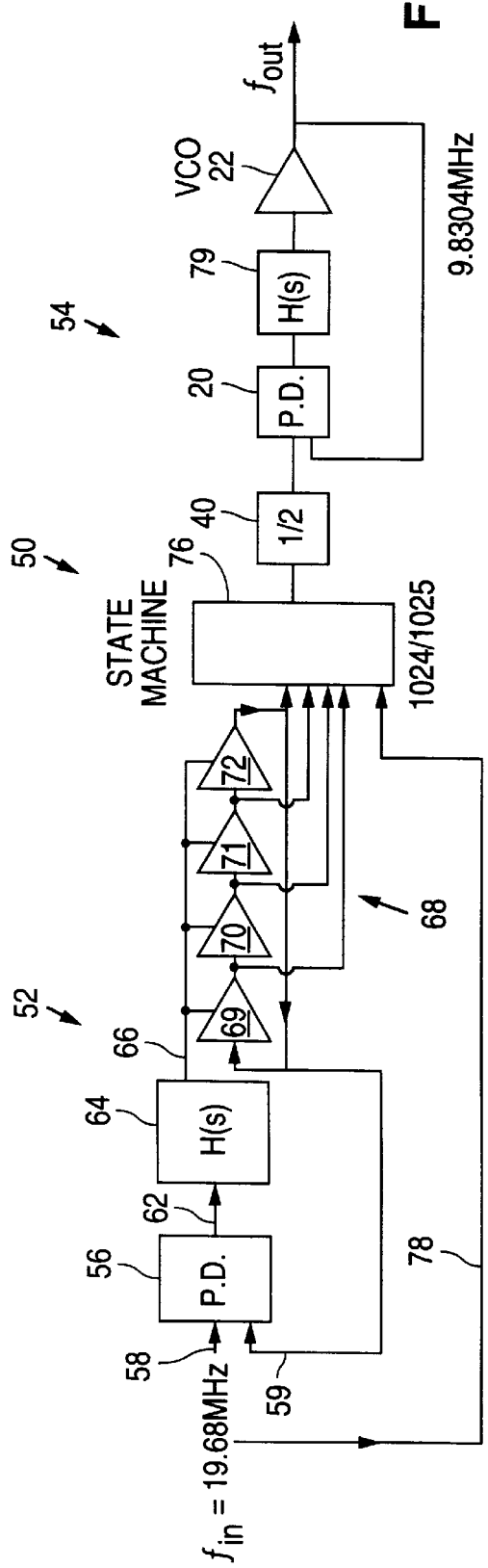
FIG. 3
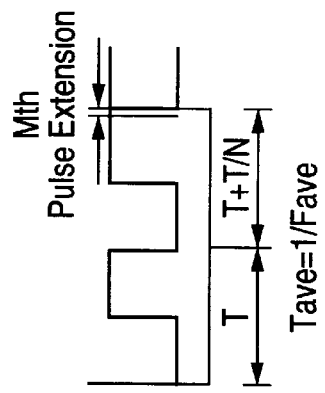
FIG. 5
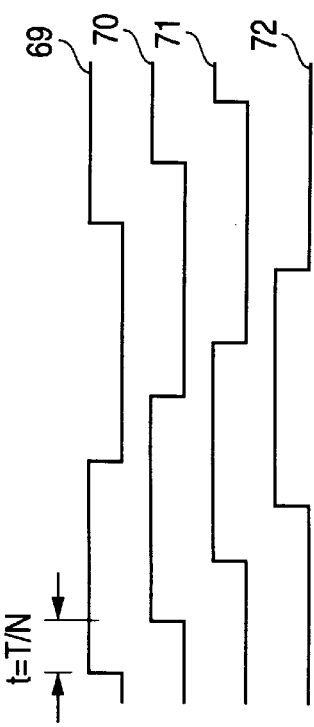
FIG. 4A
FIG. 4B
FIG. 4C
FIG. 4D

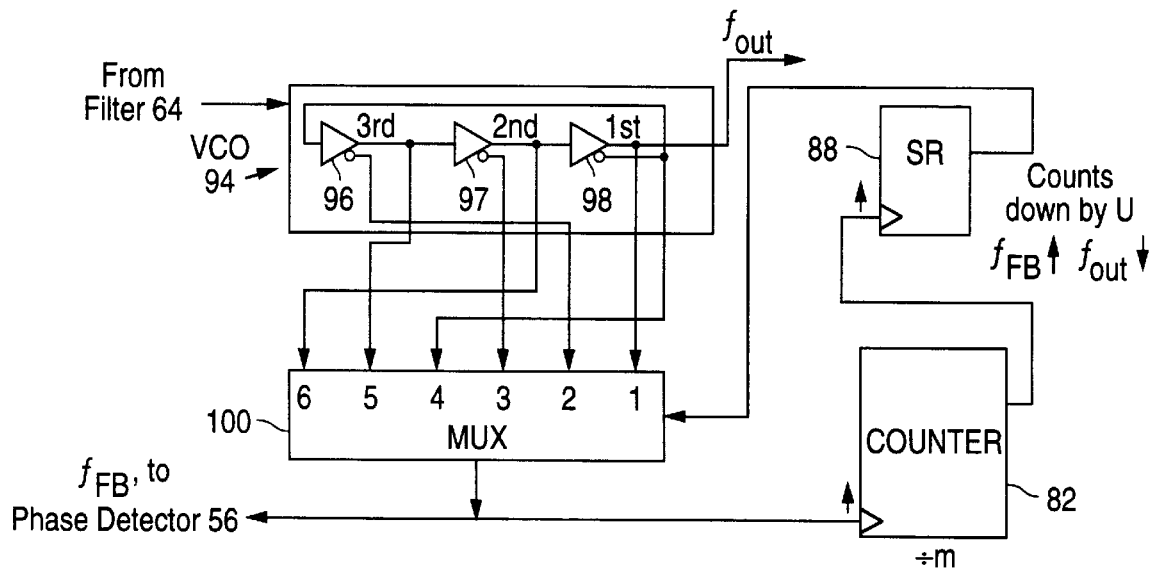
FIG. 10
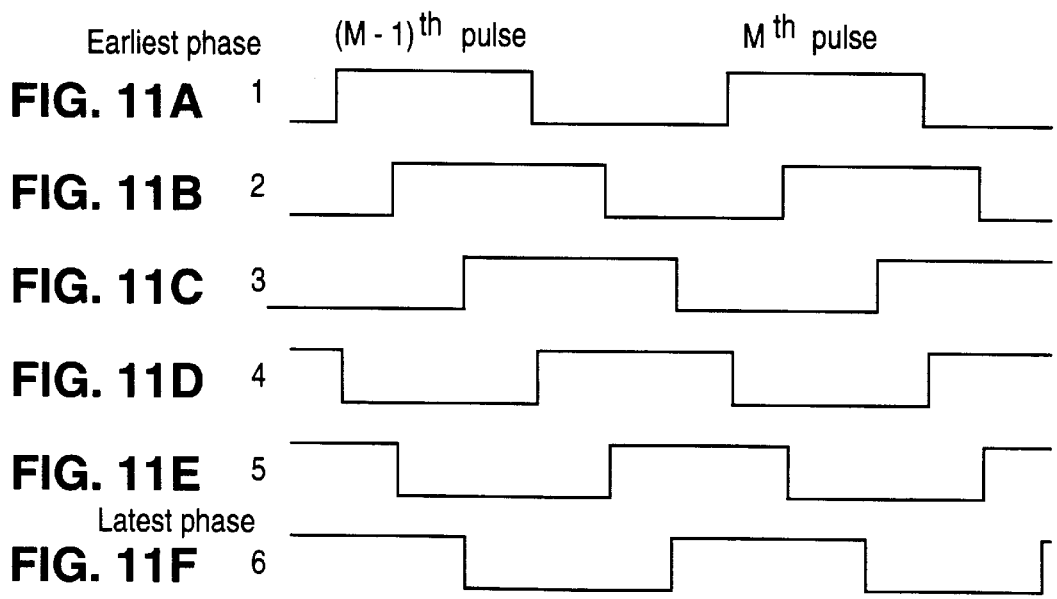
FIG. 11A  1  Earliest phase  (M-1)th pulse    Mth pulse
FIG. 11B  2
FIG. 11C  3
FIG. 11D  4
FIG. 11E  5
FIG. 11F  6  Latest phase

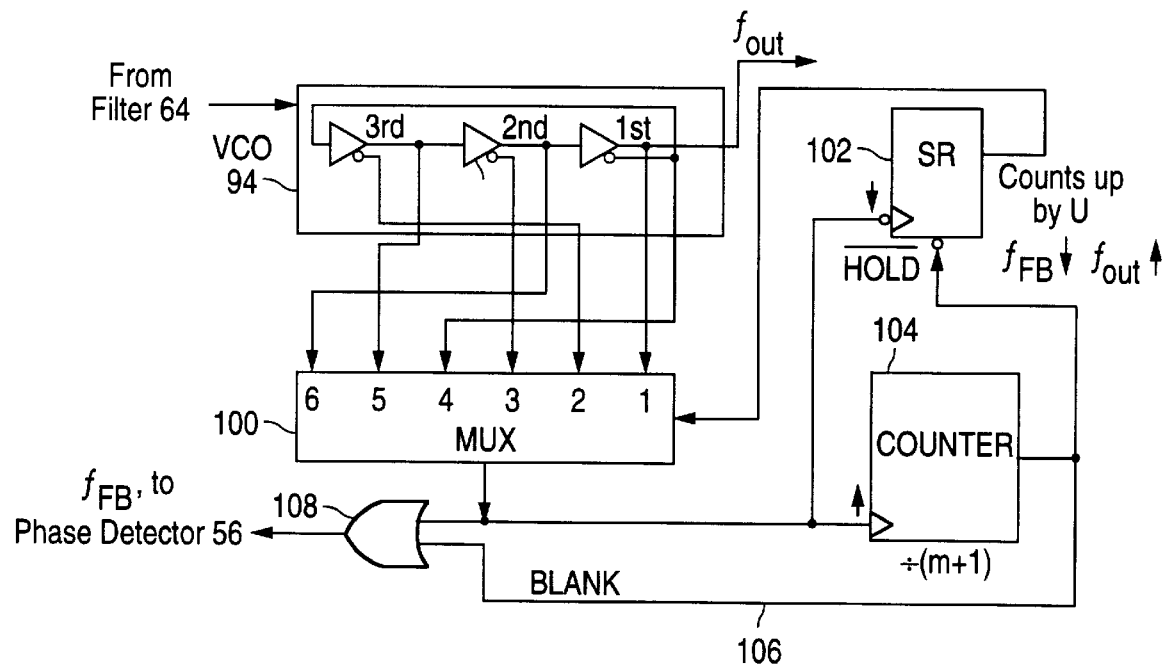
FIG. 12
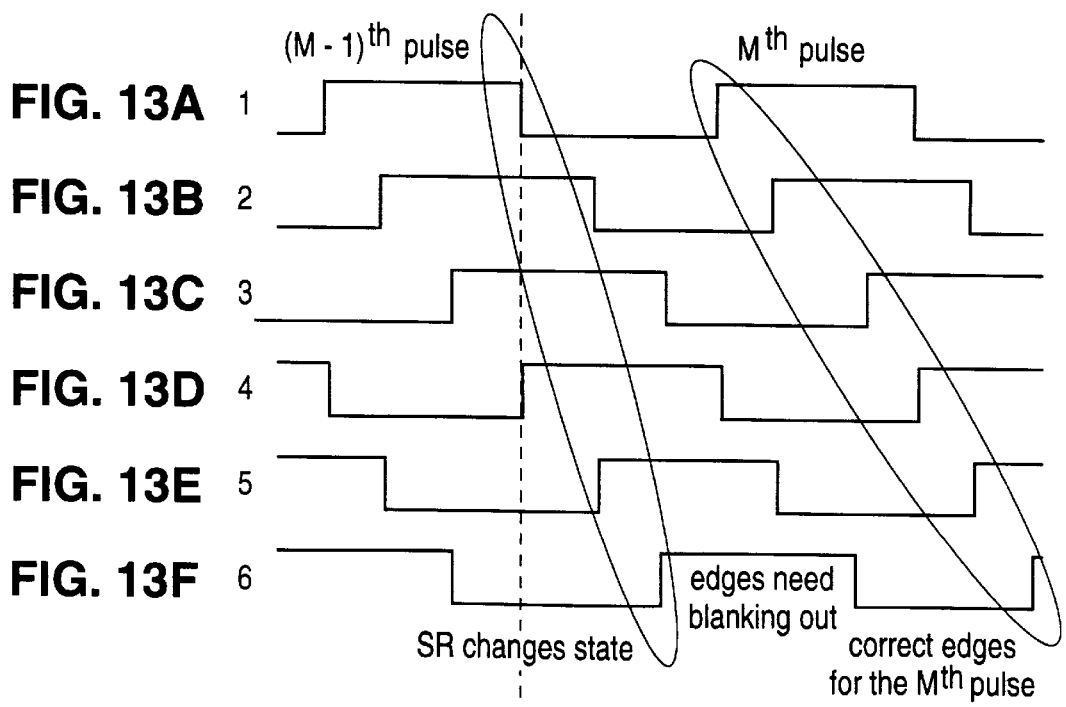

PHASE LOCKED LOOP FRACTIONAL PULSE SWALLOWING FREQUENCY SYNTHESIZER

FIELD OF THE INVENTION

This invention relates generally to phase-locked loop (PLL) circuits and, in particular, to a technique for performing pulse swallowing in a PLL circuit.

BACKGROUND OF THE INVENTION

Phase-locked loop (PLL) circuits are commonly used in frequency synthesizers found in analog and digital communications systems. A PLL typically generates an output frequency which is different from a reference frequency. FIG. 1 illustrates a basic PLL circuit 10.

In a communications system incorporating PLL circuit 10, a reference frequency of, for example, 19.68 MHz is generated within the system, and it is desired to synthesize a frequency of, for example, 9.8304 MHz. The ratio of this input frequency and output frequency is equal to 2050 divided by 1024, which is approximately 2.00195. This ratio is achieved by using dividers 12 and 14 in FIG. 1 connected to receive the signals on lines 16 and 18, respectively. These divided signals are applied to the input terminals of a phase detector 20, which compares the two signals and outputs a signal related to the difference in phase of the two input signals. There are many types of phase detectors. One type of phase detector 20 generates a positive or negative charge pulse, depending on whether the phase of the divided reference frequency leads or lags the divided output frequency. These charge pulses are accumulated to create a voltage whose amplitude is proportional to the phase difference between the two signals. Such a phase detector thus acts as a charge pump. In another embodiment, phase detector 20 outputs pulses whose widths depend on the phase difference between the two input signals. The DC component is thus proportional to the phase difference between the two input signals.

The output of phase detector 20 in response to a phase lag of the divided reference frequency causes a voltage controlled oscillator (VCO) 22 to decrease its output frequency until the signals at the inputs of phase detector 20 are matched in phase. Conversely, a phase lead of the divided reference frequency causes a signal to be generated by phase detector 20 to cause VCO 22 to increase its output frequency until the signals at the inputs of phase detector 20 are matched in phase.

A lowpass filter 26 connected between phase detector 20 and VCO 22 smooths the output of phase detector 20 into a substantially DC signal for controlling VCO 22. Filter 26 also smooths the response of the PLL to prevent overshoot or oscillations. Phase detector 20, filter 26, and VCO 22 may be any conventional circuits. VCO 22 may be an analog or digital circuit, including a digital delay line.

One problem with the PLL of FIG. 1 is that, since the divided reference frequency at the input of phase detector 20 is 19.68 MHz/2050, having a period of 104.2 microseconds, there is a relatively long time between updates. Hence, relatively large output frequency drifts may occur between the updates, and a robust low frequency filter 26 is required to filter these potentially large excursions between updates. Robust low frequency filters require large capacitive components which are not integratable on a single chip.

FIG. 2 illustrates another type of PLL 32. The scheme of FIG. 2 removes one of every 1025 pulses of the reference frequency on line 34, then divides the resulting frequency by ½, so that the frequency applied to phase detector 20 on line 41 is equal to the desired output frequency of 9.8304 MHz on line 36. Instead of using a frequency divider, a pulse swallower 38 is used in conjunction with a divide-by-2 divider 40. The pulse swallower, in the particular case of FIG. 2, counts 1024 pulses and simply deletes the 1025th pulse. This effectively results in an average frequency of 19.68 MHz times 1024/1025 being output by pulse swallower 38.

The disadvantage of the scheme in FIG. 2 is that pulse swallower 38 creates a very large phase error at the 1025th pulse. This large phase error requires a robust low pass filter 42, requiring filter 42 to incorporate large capacitors which could not be implemented on an integrated circuit.

What is needed is a PLL circuit which does not suffer from the drawbacks of PLL circuits described above.

SUMMARY

A phase-locked loop (PLL) frequency synthesizer is described which incorporates a fractional pulse swallowing circuit. The fractional pulse swallowing circuit does not add or delete pulses but extends or shortens pulses by a fractional amount. This avoids large phase errors generated by a phase detector in the PLL.

In the preferred embodiment, the PLL uses a voltage controlled oscillator (VCO) formed of a serial string of inverters (also known as a ring oscillator). An output of the last inverter is coupled to the input of the first inverter, such that the accumulated delays of the inverters creates an oscillation frequency of the ring oscillator. The outputs of the various inverters have the same frequency as the output of the VCO except at different phases. The outputs of the inverters are applied to input terminals of a state machine, which in the preferred embodiment includes a multiplexer. The multiplexer is controlled at certain times to output a different tapped signal from the ring oscillator to effectively adjust the phase of the signal output from the multiplexer. By so controlling the multiplexer, fractional pulses are subtracted or added at intervals to either increase or decrease the average frequency of the signal output from the multiplexer.

In one embodiment, the output of the VCO is fed back to the input of a phase detector along with a reference frequency. In another embodiment, the output of the pulse swallower, and not the VCO, provides the feedback signal for the phase detector. Various schemes for controlling the multiplexer are described.

BRIEF DESCRIPTION OF THE DRAWINGS

FIG. 3 is a PLL circuit in accordance with one embodiment of the invention which incorporates a fractional pulse swallower.

FIG. 4 illustrates the successive outputs of the inverter stages making up the VCO in FIG. 3.

FIG. 5 illustrates the fractional pulse extension after a predetermined number of pulses.

FIG. 10 illustrates a fractional pulse swallower for a PLL which outputs a frequency lower than a reference frequency, where a multiplexer's inputs are connected to inverted and non-inverted outputs of the inverters making up the VCO.

FIG. 11 illustrates the signals from the various inverters making up the VCO or, alternatively, illustrates the possible outputs of the multiplexer.

FIG. 12 illustrates a fractional pulse swallower similar to that of FIG. 10 but for a PLL which outputs a frequency higher than a reference frequency.

FIG. 13 illustrates the same signals as in FIG. 11 showing the blanking of leading edges.

DETAILED DESCRIPTION OF THE PREFERRED EMBODIMENTS

FIG. 3 illustrates one embodiment of a frequency synthesizer 50 consisting of a first phase-locked loop (PLL) 52 and a second PLL 54. The first PLL 52 contains a fractional pulse swallower circuit for applying a modified frequency signal to the second PLL 54. In the particular example of FIG. 3, PLL 52 provides an input signal into PLL 54 which is the reference frequency 19.68 MHz times 1024/1025. Any input frequency into PLL 52 and any fractional number (greater or less than one) may be used.

Figure 1:
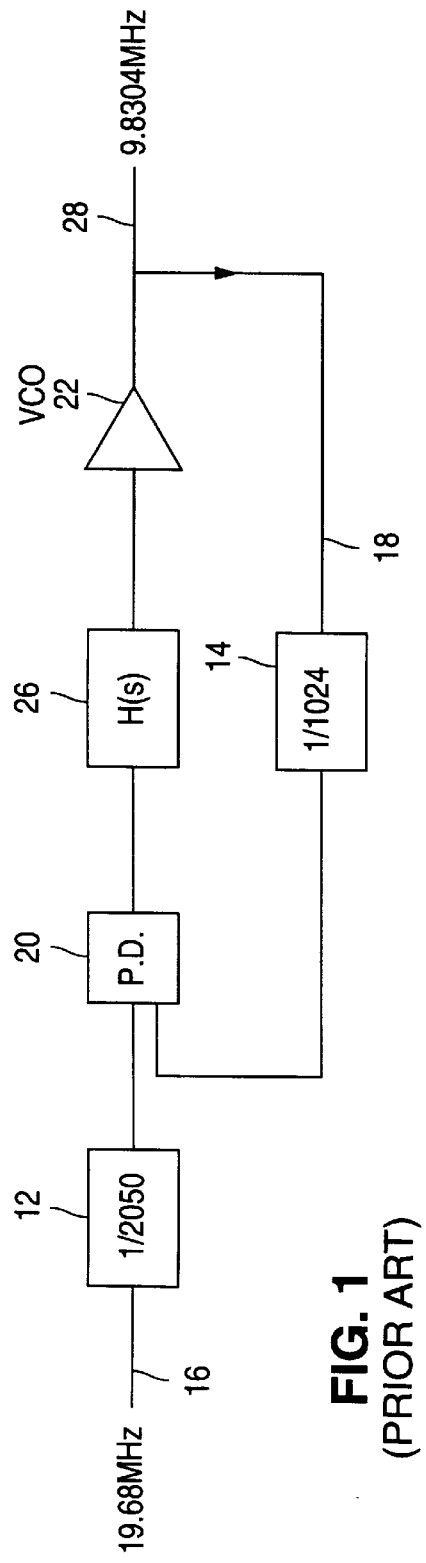
FIG. 1 illustrates a conventional phase-locked loop (PLL) circuit using two frequency dividers.

A phase detector 56 compares the two signals at its inputs 58 and 59 and outputs a signal on line 62 which is related to the phase difference between the two signals. Phase detectors are well known, and different types may be used in accordance with the invention. In one embodiment, phase detector 56 is a charge pump, increasing or decreasing the DC voltage at the output of a low pass filter 64, as described with respect to FIG. 1. In another embodiment, phase detector 56 outputs pulses having widths related to the extent that the signals on lines 58 and 59 are out of phase. For example, if the signals on lines 58 and 59 are only slightly out of phase, then a narrow pulse will be delivered on line 62 at the same frequency as the reference frequency on line 58. Such conventional phase detectors 56 are well known and need not be described in detail.

The signal on line 62 is smoothed using a low pass filter 64 to generate a substantially DC signal on line 66 related (e.g., proportional) to the phase difference between the signals on lines 58 and 59.

The signal on line 66 is used to control the frequency of a voltage controlled oscillator (VCO) 68. In the preferred embodiment, a conventional ring oscillator is used in VCO 68, which comprises a ring of delay elements, such as inverters 69–72. The voltage on line 66 is coupled to the delay control terminals of each of the inverters, wherein the delay by each of the inverters creating VCO 68 is reduced as the voltage on line 66 is increased, and vice versa. The signal on line 66 may simply be coupled to the gate of a current supply transistor for each inverter, where an increased current reduces the switching delay of the inverter. One such voltage controlled oscillator is described in U.S. patent application Ser. No. 08/442,564, now U.S. Pat. No. 5,561,398, entitled "LC-Tuned Voltage Controlled Ring Oscillator," by Richard Rasmussen, assigned to the present assignee and incorporated herein by reference, attorney docket no. NS-2759. The switching delay of each inverter causes the ring oscillator to oscillate in proportion to the total gate delay by the inverters in the ring. A lowering of the delay of each of the inverters in VCO 68 increases the output frequency of the VCO 68.

If single-ended delay elements are employed, then there must be an odd number of inverters in the ring. If the inverters have differential inputs and outputs, then an odd or even number of inverters may be used. In the example of FIG. 3, which uses four inverters in VCO 68, differential inverters are used. Controllable ring oscillators are well known in the art and any type may be used in VCO 68.

The outputs of each of the inverters 69–72 produce signals having identical frequencies but differing phases. These signals at the outputs of the various inverters 69–72 are shown in FIG. 4, where the phase of the output of inverter 69 leads that of inverter 70 and so on. If differential inverters are used, each inverter outputs an inverted and non-inverted signal. Thus, each output signal shown in FIG. 4 may also be inverted.

Each of the tapped outputs of VCO 68 is applied to the input of a state machine 76, which in the preferred embodiment incorporates a multiplexer and controller, as will be described later. State machine 76 is controlled to output one of the four tapped outputs to PLL 54.

Assuming that state machine 76 generates 1024 output pulses for every 1025 input pulses, instead of every 1025th pulse being deleted as would be performed by a conventional pulse swallower, state machine 76 performs four delay shifts over 1025 pulses, each shift delaying the phase of a single pulse output from state machine 76 by one-fourth the period T of the reference frequency signal. Preferably, the phase shifts are spread out evenly over the 1025 pulses. In the example of FIG. 3, since there are four inverters 69–72, state machine 76 counts 1025/4 pulses on line 78, then controls an internal multiplexer to output a T/4 delayed phase signal from a different one of inverters 69–72. FIG. 5 illustrates the extension of the Mth pulse by T/N, where N is the number of delay elements used in the VCO. By shifting in the direction from inverter 69 to inverter 72, in a wrap-around fashion, such a delay takes place. At the end of 1025 pulses on line 78, four shifts have been performed by state machine 76 to effectively delete an entire pulse during the period of 1025 pulses. The average frequency of the signal output from state machine 76 is thus 19.68 MHz multiplied by 1024/1025.

Any number of inverters or delay elements may be used in VCO 68, and state machine 76 may perform any fractional pulse swallowing of the reference signal. In one embodiment, 32 inverters are used in the VCO. By using differential inverters, or a state machine with an invertible output, there are twice as many possible phase shifts as inverters, thus allowing less phase error per shift. Non-inverting buffers may also be used as the delay elements in VCO 68, where an inverter is used as an input to one of the buffers.

Figure 2:
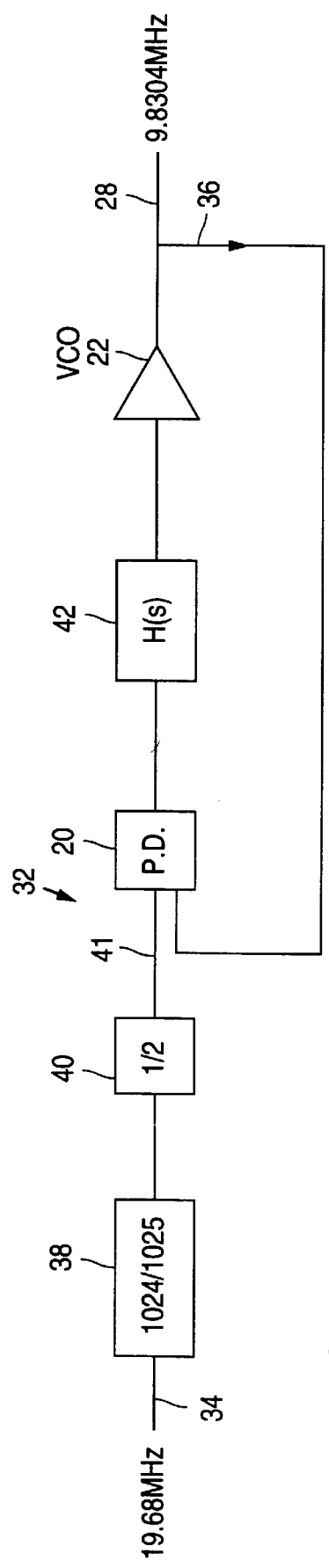
FIG. 2 illustrates a conventional PLL circuit using a pulse swallower.

The resulting signal output from state machine 76 is applied to PLL 54, which may use a divider 40, phase detector 20, and VCO 22 identical to those used in FIG. 2. VCO 22 in FIG. 3 may be any known VCO and need not be a ring oscillator. PLL 54 generates an output frequency $f_{out}$ equal to the average frequency of the output of divider 40.

This technique of modifying the frequency of the reference signal applied to PLL 54 results in the need for much smaller low pass filters 64 and 79. This is because the first PLL 52 is operating at the relatively high speed of the reference frequency (19.68 MHz) and not at a divided down frequency, and thus filter 64 requires only small passive components which can be integrated onto a single chip. Additionally, since no pulses are being dropped in the first PLL 52, there is relatively little phase error to be detected by phase detector 20 in PLL 54. This enables low pass filter 79 to be less robust and smaller. Accordingly, the entire frequency synthesizer 50, including filters 64 and 79, may now easily be implemented on a single chip along with other circuitry.

Although VCO 68 is shown as a ring oscillator, any suitable oscillator or delay line which provides different phases may be used, where these different phases are applied to the inputs of a state machine. VCO 68 may consist of a voltage controlled delay line which, instead of using a delay control signal to each inverter to increase or decrease the delay by each inverter, receives a control signal to select a tap of the delay line for being fed back into the delay line to adjust its frequency. A digital delay line used in a phase-locked loop is described in U.S. Pat. No. 5,355,037, entitled "High Performance Digital Phase Locked Loop," incorporated herein by reference.

Although the structure of FIG. 3 was described in the context of generating an output frequency lower than the reference frequency, the same structure may be used to generate an output frequency greater than the reference frequency by simply controlling the multiplexer internal to state machine 76 to shift the tapped signals in a direction opposite to that previously described (i.e., shifting in the direction from inverter 72 to inverter 69 in a wrap-around fashion). This subtracts a fractional pulse of T/N from every Mth pulse to increase the average frequency of the output of state machine 76.

Figure 6:
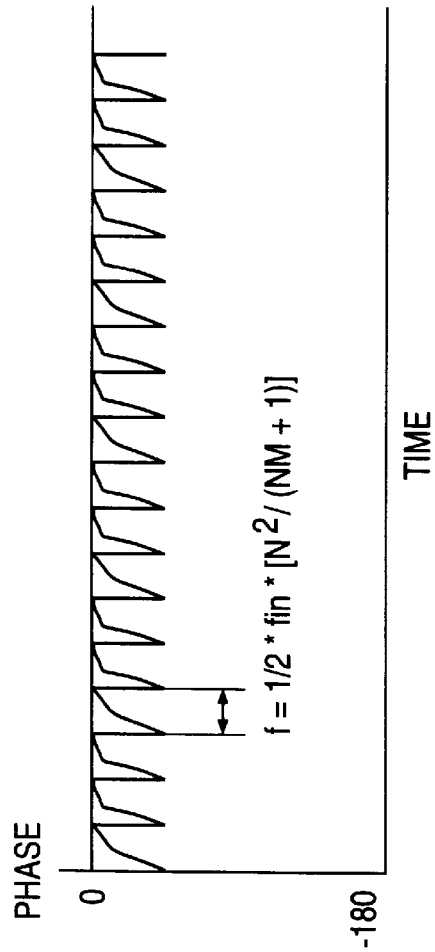
FIG. 6 is a graph of phase versus time to illustrate the reduction in phase error when using the pulse swallower of FIG. 3.

FIG. 6 illustrates the reduction in phase error using the technique of the present invention and also illustrates the relatively high frequency at which the phase error occurs. This frequency is given by the equation, $$f = \tfrac{1}{2} \cdot f_{IN} \cdot [N^2/(NM+1)] \qquad (Eq. 1)$$

where N equals the number of phases (or taps) in the VCO, M is the pulse count between pulse adjustments, and $f_{IN}$ is the reference frequency. For a 32 inverter ring oscillator, every 32nd pulse in the 1025 pulse period will be adjusted. In accordance with Eq. 1, given a $f_{IN}$ of 19.68 MHz, the frequency applied to phase detector 20 in FIG. 3 will be 9.8304 MHz.

The frequency synthesizer 50 in FIG. 3 generates a synthesized output signal with low jitter which can be used to clock system components integrated onto a single chip. Such a chip may be used in a communications system, such as a cellular communications system.

Figure 7:
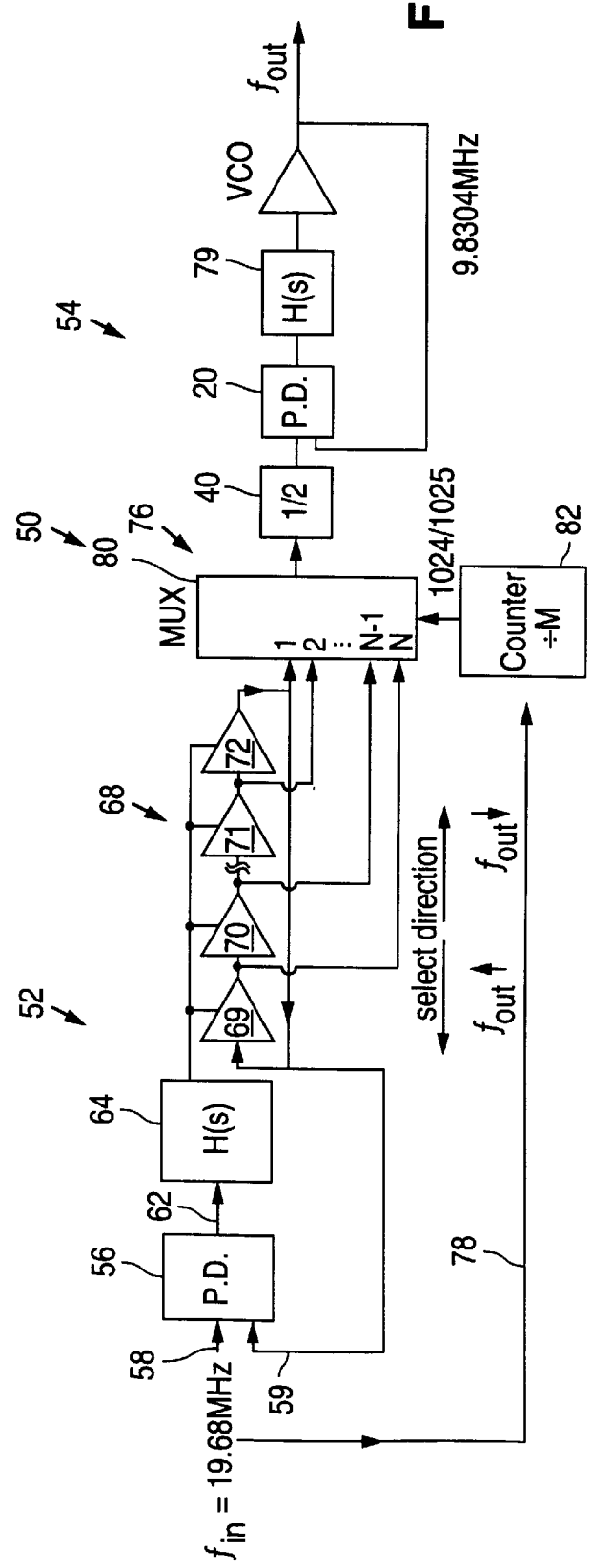
FIG. 7 illustrates the PLL of FIG. 3 incorporating a multiplexer as part of the fractional pulse swallower.

FIG. 7 illustrates the preferred embodiment of the frequency synthesizer 50 of FIG. 3, showing in greater detail the structure of state machine 76. Elements identified in the various figures with the same numerals may be identical. In the embodiment of FIG. 7, state machine 76 consists of a multiplexer 80 having inputs connected to the outputs of each inverter 69–72 or delay element in VCO 68. A divided output of multiplexer 80 is connected to phase detector 20. Divider 40 may be deleted, depending upon the desired output frequency.

A counter 82 (or divider) for counting the reference frequency pulses is connected to a control terminal of multiplexer 80 to control multiplexer 80 to output one of its input signals. In the preferred embodiment, counter 82 is a modulo M counter which wraps around after M counts. As previously described, the number M is the number of pulses between pulse width corrections, as shown in FIG. 5. Accordingly, after M pulses are applied to the input of counter 82, the output of counter 82 will change states to control multiplexer 80 to output a different one of its input signals, depending upon whether the Mth pulse is to be extended or shortened, as previously described.

Counter 82 may be any type of counter or divider, such as a shift register, binary counter, or other conventional counter. Additionally, counter 82 may receive input signals from any source as long as multiplexer 80 is triggered on every Mth pulse.

In the preferred embodiment, each of the inverters 69–72 in VCO 68 has a differential input and a differential output to provide inverting and non-inverting outputs. In one embodiment, both the inverting and non-inverting output signals of each inverter are applied to an input of multiplexer 80. Hence, there will be 2N inputs into multiplexer 80, where N is the number of inverters, and a pulse output from the fractional pulse swallower may then be fractionally increased or decreased by T/2N, where T is the period of the reference frequency.

In another embodiment of a PLL using a fractional pulse swallower, the second PLL 54 in FIGS. 3 and 7 is deleted to further reduce the size of the frequency synthesizer. This alternative embodiment PLL 86 is illustrated in FIG. 8.

Figure 8:
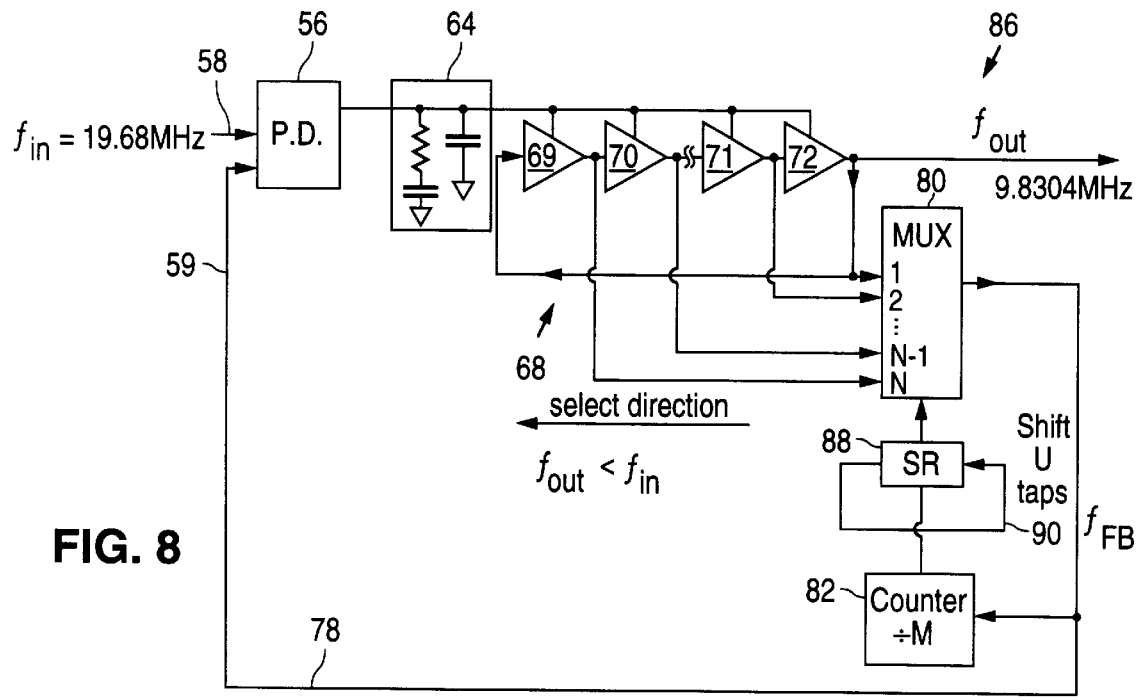
FIG. 8 illustrates a PLL in accordance with another embodiment of the invention which obviates the requirement of two PLL's in a frequency synthesizer.

In FIG. 8, a fractional pulse swallower similar or identical to that used in FIGS. 3 and 7 may be used, with the difference being that the output of multiplexer 80 is fed back into phase comparator 56, rather than being applied to a second PLL. The output of VCO 68 provides the output frequency for the frequency synthesizer. A counter 82 counts the feedback frequency pulses on line 78. Using the technique shown in FIG. 8, the output of multiplexer 80 is controlled by PLL 86 to match the reference frequency on line 58. The output frequency of VCO 68 can be set to any frequency by suitably controlling multiplexer 80. A divider to divide the feedback frequency and/or the reference frequency may also be used to select the output frequency.

PLL 86 in FIG. 8 forces the average frequency of the feedback frequency $f_{FB}$ applied to phase detector 56 to follow the phase and frequency of the input or reference frequency $f_{IN}$. The fractional pulse swallower selects which tap of VCO 68 to feedback to phase detector 56 so that $f_{FB}$ matches $f_{IN}$. All taps of VCO 68 run at the same frequency as the output frequency $f_{OUT}$, but are phase shifted for each delay stage by $\pi/N$ radians, or by $T_{OUT}/2N$ in time, where N is the number of different inverter stages in the ring oscillator and $T_{OUT}$ is the period of the output frequency $f_{OUT}$. The fractional pulse swallower phase shifts $f_{FB}$ by $U(T_{OUT}/2N)$ every M output pulses, U being the number of delay stages shifted during a single shift. A shift register 88 may be used if U is greater than one. The value of M and U are chosen so that VCO 68 outputs the desired frequency $f_{OUT}$, while the PLL 86 forces the average period of $f_{FB}$ to equal that of the input frequency $f_{IN}$.

The fractional pulse swallower in FIG. 8 has added flexibility in that multiplexer 80 can be controlled to shift the selection of an input tap by more than one delay stage. Hence, on the Mth pulse of the feedback signal to phase detector 56, counter 82 controls a bit in shift register 88 to shift U bits, where the position of a logical 1 bit in the shift register corresponds to the tap selected by multiplexer 80. One skilled in the art would understand how to shift a bit in a shift register by any number of bits upon receiving an input signal. The shift of U bits could be any number from one to N-1, and may shift in either direction to either increase the width of a pulse or decrease the width of a pulse.

A feedback path 90 is illustrated in FIG. 8 so that the logical 1 bit in shift register 88 wraps around so as to provide a continuous reduction or continuous increase of the feedback frequency in order to match the reference frequency.

In the preferred embodiment, multiplexer 80 is a glitchless multiplexer (i.e., introduces no noise) to ensure no erroneous phase comparisons occur by phase comparator 56.

Figure 9A:
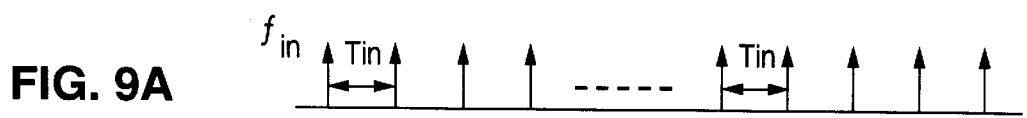
FIG. 9 illustrates the fractional reduction in the period of feedback pulse by the fractional pulse swallower in any of the PLL embodiments.
Figure 9B:
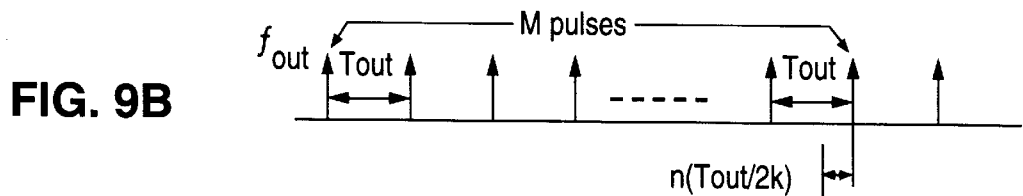
Figure 9C:
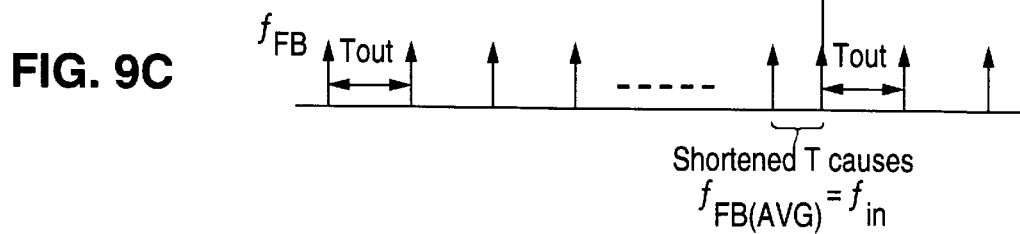

FIG. 9 is an example of pulses generated at the input frequency $f_{IN}$, the output frequency $f_{OUT}$ of VCO 68, and the feedback frequency $f_{FB}$. As seen from FIG. 9, the output frequency is a constant, while the Mth pulse of the feedback frequency is accelerated to cause the average frequency of the feedback frequency to equal that of the input frequency to balance the PLL. In FIG. 9, the output frequency is less than the input frequency. If the output frequency were to be greater than the input frequency, the Mth pulse of the feedback frequency would be extended to thus increase the average frequency of the feedback frequency to match that of the input frequency.

An expression for $f_{OUT}$ can be shown as $$f_{OUT} = \{[M-(U/2N)]/M\} \times f_{IN}$$

where the term inside the {} is the frequency scaling factor. For example, if we want an output frequency that is $(1024/1025) \times f_{IN}$, we may choose M=205, U=2, N=5. That is a ÷205 divider or counter, a 5-stage ring oscillator VCO, and a shift register that shifts to the left by 2 taps. For every M pulses, $f_{FB}$ abruptly shifts 2(Tout/2N) seconds or 2(2π/10) radians. By comparison, the phase jump would be 2π if conventional pulse swallowing techniques were used, a factor of 5 or larger. The smaller the (U/N) value we can use, the smaller the phase jump will be, resulting in a smaller phase jitter on the output. The smallest value for U is 1, and the minimum delay in each ring oscillator delay stage limits how large N can be. If an output frequency is to be higher than the input reference frequency, U is made negative, that is right shifting by the shift register. The above expression for $f_{OUT}$ is still valid for this case.

If the ring oscillator used differential type inverters, then the pulse swallower could perform 2N phase changes, where N is the number of inverters. Alternatively, even if the inverters in VCO 68 were single ended types, the output of multiplexer 80 can be controlled to provide an inverted output under the control of shift register 88 if shift register 88 selects one of the phases between N(π/N) to (2N-1)(π/N), so as to still provide up to 2N different phase shifts to thus reduce the magnitude of phase error to be detected by the phase detector.

FIG. 10 illustrates a fractional pulse swallower when used with a VCO 94 having three differential type inverters 96, 97, 98. The inverting and non-inverting outputs of each of the inverters 96-98 are connected to the inputs of multiplexer 100.

FIG. 11 illustrates the output of multiplexer 100 as each of the inputs 1-6 is selected. Note that inputs 3, 2, and 1 are inverted versions of the signals at inputs 6, 5, and 4. As previously mentioned, even if VCO 94 in FIG. 10 did not use differential inverters, controlling an inverter at the output of multiplexer 100 could produce the six multiplexer outputs shown in FIG. 11.

One skilled in the art would understand that the illustrated circuits may be modified but still carry out the same functions. For example, the counter and the shift register functions may be merged into a single circuit. As previously mentioned, the shift register could be deleted if only one inverter delay needed to be shifted at a time. The shift register can also be a counter or any other suitable device.

Since the multiplexer 100 inputs are switched from left to right (i.e., 6 through 1) in a wrap-around fashion, the circuit of FIG. 10 is used to cause the output frequency to be less than the input frequency so that the fractional pulse swallower effectively speeds up the feedback output frequency during phase shifts. The connections of the taps to the inputs of multiplexer 100 may, of course, be changed so that shifting from right to left may also result in a lowering of the output frequency.

It is assumed that the phase detector 56 connected to the output of multiplexer 100 responds only to the rising edges of its inputs and shift register 88 has sufficient delay so that, when it changes state and selects a different VCO 94 tap, a next pulse from the newly selected tap appears at the multiplexer output. Upon the rising edge of the (M-1)th pulse, determined by counter 82, shift register 88 counts down by the predetermined number (U) of taps to select the next tap. After shift register 88 changes state, the current tap may still be at a logical 1 state, but the new tap selected can be at a logical 1 or 0 state. If the new tap is at a logical 0 state, a narrow pulse will appear on the feedback frequency line. The pulse width equals the delay of counter 82 and shift register 88. This delay must be large enough so that the pulse width is sufficiently large for the phase detector to recognize it. Multiplexer 100 will follow the next rising edge of the newly selected VCO tap. Counter 82 then goes to the count of 1 and shift register 88 holds its current value. At the end of another M-1 pulses, the cycle starts over again.

In the case where the output frequency is higher than the reference frequency, the fractional pulse swallower effectively decreases the average feedback frequency to match the reference frequency. In this case, the fractional pulse swallower of FIG. 12 may be used, where shift register 102 counts up by U taps rather than counts down by U taps as in FIG. 10. In FIG. 12, shift register 102 selects a new phase on the negative edge of the multiplexer 100 output, counter 104 counts to M+1 before controlling shift register 102, and a blanking pulse on line 106, applied to OR gate 108, is used to suppress the multiplexer 100 output glitch from being transmitted to the feedback frequency input of the phase detector 56.

FIG. 13 illustrates the waveforms of the six VCO 94 taps in FIG. 12 as they appear at the multiplexer 100 inputs. Shift register 102 has an inverter coupled to its input clock terminal. When a falling edge of the multiplexer 100 output causes shift register 102 to select a different VCO tap, the next rising edge of the selected tap may not correspond to the Mth pulse. This is illustrated in FIG. 13 where shift register 102 is triggered on the falling edge of tap number 1, but taps 5 and 6 have a rising edge of the (M-1)th pulse occurring after that time. Accordingly, the edges for any rising edges occurring prior to the Mth pulse must be blanked out. The blanking pulse in FIG. 12 is started by the rising edges of the multiplexer 100 output just prior to when shift register 102 changes state so as to inhibit these undesirable rising edges of the selected tap from being transmitted to phase detector 56. The blanking pulse keeps the feedback frequency high until the rising edges of the blanked-out pulses reset the feedback frequency pulse by incrementing counter 104. Because of this extra count by these blanked-out pulses, counter 104 needs to count up to M+1. The delay of shift register 102 must be long enough to allow multiplexer 100 to output a sufficiently wide pulse to increment counter 104.

Accordingly, a number of fractional pulse swallowing circuits have been shown. Those skilled in the art may easily modify the illustrated fractional pulse swallowers to incorporate ring oscillators, consisting of inverters or non-inverting delay elements, or a tapped delay line of any length to provide any fractional pulse swallowing. A number of applications of the fractional pulse swallower have also been described in various embodiments of a phase locked loop frequency synthesizer. All embodiments of frequency synthesizers described herein are preferably formed on a single integrated circuit chip.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A frequency synthesizer providing a synthesizer output frequency comprising:

a phase detector having a first input terminal for receiving a reference frequency and a second input terminal for receiving a feedback frequency;

a plurality of delay stages operating at an output frequency, each delay stage having a stage output terminal, each stage output terminal providing a signal at said output frequency but at a phase different from phases at other stage output terminals, an output of said phase detector controlling said output frequency;

a tap selector having tap inputs connected to a plurality of said stage output terminals and having an output providing a signal corresponding to a selected tap; and a modulo-M counter, for counting pulses at said reference frequency connected to a control input of said tap selector for selecting a different one of said tap inputs of said tap selector upon detection of every M pulses at said reference frequency so as to control a phase of said output of said tap selector, said output of said tap selector providing a signal having an average frequency different from said output frequency of said plurality of delay stages.

2. The synthesizer of claim 1 wherein said output of said tap selector is applied to said second input terminal of said phase detector.

3. The synthesizer of claim 2 wherein said output of said tap selector is applied to said second input terminal via a divider.

4. The synthesizer of claim 1 wherein said output of said tap selector provides an input signal for a phase locked loop circuit whose output is a synthesizer output frequency.

5. The synthesizer of claim 1 wherein one of said stage output terminals is connected to said second input terminal of said phase detector.

6. The synthesizer of claim 1 wherein said tap selector is a multiplexer.

7. The synthesizer of claim 1 wherein said counter further comprises a means connected between an output of said counter and said control input of said tap selector for selecting other than adjacent ones of said tap inputs.

8. The synthesizer of claim 1 further comprising a filter connected between an output of said phase detector and said plurality of delay stages.

9. The synthesizer of claim 1 wherein said plurality of delay stages comprises a ring oscillator.

10. The synthesizer of claim 1 wherein an output of said phase detector controls a delay by each of said delay stages to control said output frequency of said delay stages.

11. The synthesizer of claim 1 wherein said synthesizer output frequency is greater than said reference frequency.

12. The synthesizer of claim 1 wherein said synthesizer output frequency is less than said reference frequency.

13. A frequency synthesizer providing a synthesizer output frequency comprising:

a phase detector having a first input terminal for receiving a reference frequency and a second input terminal for receiving a feedback frequency;

a plurality of delay stages operating at an output frequency, each delay stage having a stage output terminal, each stage output terminal providing a signal at said output frequency but at a phase different from phases at other stage output terminals, an output of said phase detector controlling said output frequency;

a tap selector having tap inputs connected to a plurality of said stage output terminals and having an output providing a signal corresponding to a selected tap; and a controller connected to a control input of said tap selector for selecting a different one of said tap inputs of said tap selector upon detection of every M pulses of a signal so as to control a phase of said output of said tap selector, said output of said tap selector providing a signal having an average frequency different from said output frequency of said plurality of delay stages, wherein a fixed one of said stage output terminals provides the synthesizer output frequency, wherein said controller comprises a modulo-M counter and a shift register connected between an output of said counter and said control input of said tap selector for selecting other than adjacent ones of said tap inputs.

* * * * *